(12) United States Patent
Dibbs et al.

(10) Patent No.: US 7,399,504 B2
(45) Date of Patent: Jul. 15, 2008

(54) METHOD OF PREPARING AN INSOLUBLE POLYMER FILM ON A SUBSTRATE FROM A SOLUBLE POLYMER CONTAINING LABILE SOLUBILIZING GROUPS

(75) Inventors: Mitchell Gene Dibbs, Midland, MI (US); Michael Inbasekaran, Midland, MI (US); Paul Henson Townsend, III, Mesa, AZ (US); Kenneth L. Foster, Brighton, MI (US); Shaoguang S. Feng, Midland, MI (US); David J. Brennan, Midland, MI (US); Q. Jason Niu, Midland, MI (US); James P. Godschalx, Midland, MI (US); Dean M. Welsh, Midland, MI (US); Ray E. Drumright, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 386 days.

(21) Appl. No.: 10/936,010

(22) Filed: Sep. 8, 2004

(65) Prior Publication Data

US 2005/0106324 A1    May 19, 2005

Related U.S. Application Data

(60) Provisional application No. 60/503,229, filed on Sep. 16, 2003.

(51) Int. Cl.
*B05D 3/02* (2006.01)
*B05D 3/06* (2006.01)
*B05D 3/10* (2006.01)

(52) U.S. Cl. .................. 427/532; 427/553; 427/557; 427/558; 427/226; 427/337; 427/340; 427/341

(58) Field of Classification Search .............. 427/532, 427/553, 557, 558, 226, 337, 340, 341
See application file for complete search history.

(56) References Cited

U.S. PATENT DOCUMENTS

| 5,708,130 | A | 1/1998 | Woo et al. .............. 528/397 |
| 6,169,163 | B1 | 1/2001 | Woo et al. .............. 528/397 |
| 7,095,044 | B2* | 8/2006 | Brown et al. ............ 257/40 |
| 2004/0266207 | A1* | 12/2004 | Sirringhauss et al. ...... 438/725 |

(Continued)

OTHER PUBLICATIONS

Brown, A.R., et al., "Field-effect transistors made from solution-processed organic semiconductors," *Synthetic Metals*. 1997. vol. 88, pp. 37-55.

(Continued)

*Primary Examiner*—Erma Camerson
(74) *Attorney, Agent, or Firm*—Sughrue Mion, PLLC

(57) ABSTRACT

The present invention relates to a method for preparing polymeric films, preferably electroactive films, with enhanced physical properties by the steps of applying to a substrate a solution of a polymer containing pendant labile solubilizing groups, then removing the solvent and a sufficient concentration of the labile solubilizing groups render the polymer less soluble in the solvent than before the labile groups were removed. It is believed that the removal of pendant soluble groups a) permits optimization of the semiconducting backbone for charge transport performance, b) allows direct control of microstructure in the final film, and c) renders the final film more robust during subsequent process steps needed to construct multilayer devices.

16 Claims, 1 Drawing Sheet

OTHER PUBLICATIONS

Gaup, C.L., et al., "Poly(3,4-ethylenedioxypryole): Organice Electrochemistry of a Highly Stable Electrochromic Polymer," *Macromolecules*. 2000. vol. 33, pp. 1132-1133.

Leadbeater, N.E., et al., "Transition-Metal-Free Suzuki-Type Coupling Reactions; Scope and Limitations of the Methodology," *J. Org. Chem*. 2003. vol. 68, No. 14, pp. 5660-5667.

Liu, J., et al., "Polythiophene Containing Thermally Removable Solubilizing Groups Enhances the Interface and the Performance of Polymer—Titania Hybrid Solar Cells," *J. Am. Chem. Soc*. 2004. vol. 126, pp. 9486-9487.

Sirringhaus, S., et al. "High-Resolution Inkjet Printing of All-Polymer Transistor Circuits," *Science*. 2000. Volument 290, pp. 2123-2126.

Skotheim, T.A., Elsenbauner, R. L. & Reynolds, J.R. (eds.), *Handbook of Conducting Polymers*. 2nd ed. 1998. Chapter II, pp. 197-422 (and references therein).

Tsuie, B. et al., "Electroactive and luminescent polymers: new fluorene-herterocycle-based hybrids," *Journal of Materials Chemistry*. 1999. vol. 9, pp. 2189-2200.

Yu, J., et al., "Structural Order in Conjugated Organic Films Prepared by Catalytic Deprotection of Self-Assembled Polymers," *Chem. Mater*. 2001. vol. 13; pp. 526-529.

* cited by examiner

METHOD OF PREPARING AN INSOLUBLE POLYMER FILM ON A SUBSTRATE FROM A SOLUBLE POLYMER CONTAINING LABILE SOLUBILIZING GROUPS

CROSS-REFERENCE STATEMENT

This application claims the benefit of U.S. Provisional application No. 60/503,229 filed Sep. 16, 2003.

BACKGROUND OF THE INVENTION

The present invention relates to a method of preparing a polymer with reduced solubility in an organic solvent from a polymer that is soluble in the solvent by virtue of the presence of solubilizing groups which, when removed or converted to nonsolubilizing groups, form the polymer that has reduced solubility in the solvent.

Electroactive polymers such as conjugated polymers containing structural units of a fluorene monomer are useful as thin films in electronic devices such as organic light emitting diode displays (OLEDs) or transistors. Typically, a solution of an electroactive polymer such as poly(9,9-dioctyl fluorene-alt-bithiophene) dissolved in xylenes is applied to a substrate by techniques such as spin coating or ink jet printing, whereupon solvent is removed to form a thin film of the soluble polymer with desirable electroactive properties. The presence of the octyl groups on the fluorene structural units of the polymer imparts solubility and improves the handling characteristics of the polymer, but may disadvantageously degrade the transport characteristics and prevent the formation of ordered microstructure in the final film.

Although polymer films containing ordered microstructure are clearly desired, polymers that intrinsically develop such structure tend to be insoluble in precursor ink solutions. Therefore, applying these preferred polymers to substrates by solution processing is impractical if not impossible. While it is possible to apply an insoluble polymer onto a substrate by means such as evaporation, sputtering, or plasma enhanced chemical vapor deposition, these techniques are slow and expensive.

Consequently, it would be desirable to prepare an insoluble electroactive organic film on a substrate from a material that can be easily and reproducibly applied to the substrate.

SUMMARY OF THE INVENTION

The present invention addresses a need in the art by providing in a first aspect a method comprising the steps of a) applying to a substrate a solution of a solvent and a polymer containing labile solubilizing groups; b) removing the solvent from the solution to form a soluble polymer film; and c) removing or converting a sufficient amount of the labile solubilizing groups from the soluble polymer film to form a film on the substrate that is less soluble in the solvent than before the removal or conversion of the labile solubilizing groups, wherein the polymer contains structural units selected from the group consisting of fluorene-2,7-diyls and triarylamine-diyls.

In a second aspect, the invention is an electronic device comprising a coated substrate prepared by the steps of a) applying to the substrate a solution of a solvent and an electroactive polymer containing labile solubilizing groups; b) removing the solvent from the solution to form a soluble polymer film; and c) removing or converting a sufficient amount of the labile solubilizing groups from the soluble polymer film to form a film that is less soluble in the solvent than before the removal or conversion of the labile solubilizing groups, wherein the polymer contains structural units selected from the group consisting of fluorene-2,7-diyls and triarylamine-diyls.

DETAILED DESCRIPTION OF THE INVENTION

Figure 1:
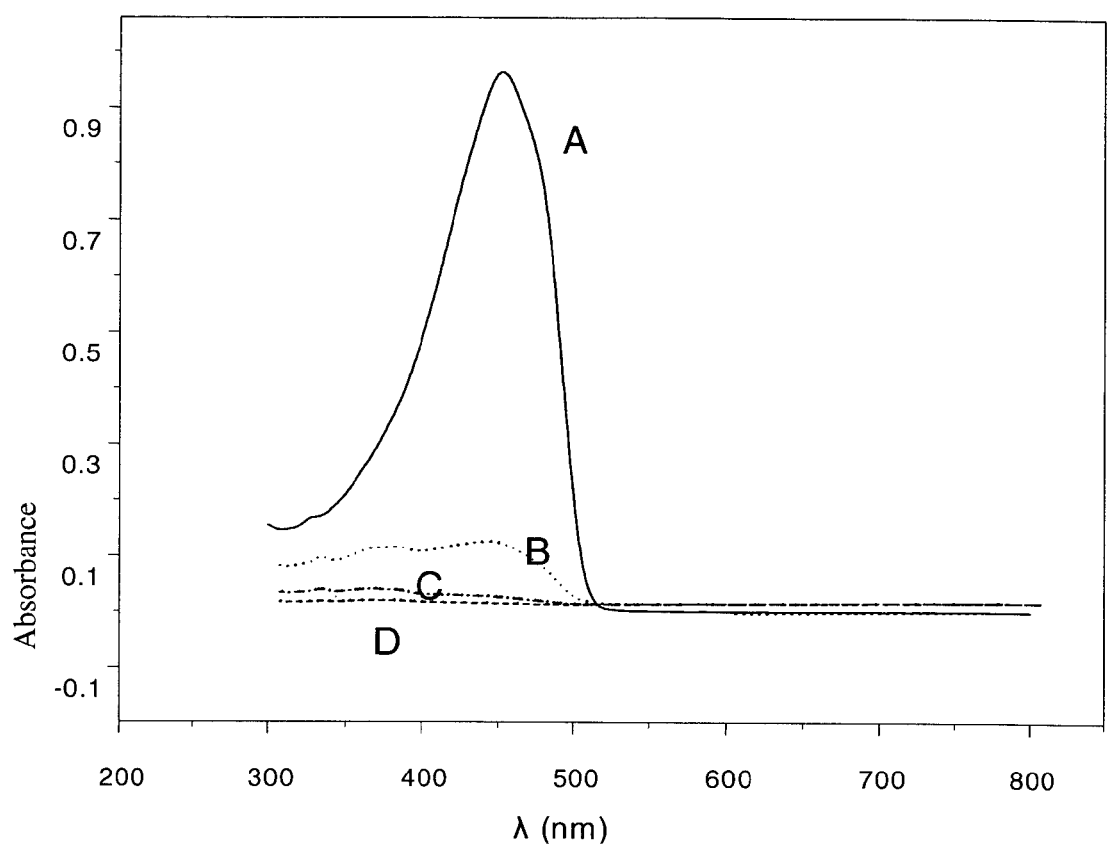
FIG. 1 is an illustration of the visible spectra of solvent washings of substrates coated with thermally treated copolymers of dioctylfluorene-bithiophene.

In a first aspect, the present invention relates to a method of forming an insoluble film on a substrate comprising the steps of applying a polymer dissolved in a solvent onto the substrate, then removing the solvent and subjecting the polymer to conditions that render the polymer less soluble, preferably virtually or totally insoluble in the solvent. The polymer, which is preferably conjugated and electroactive, is characterized by containing pendant labile solubilizing groups that, on the one hand, facilitate the dissolution of the polymer in a solvent and, on the other hand, are selectively removable or convertible so as to inhibit redissolution of the polymer. The labile groups are removable or convertible by any of a number of means including thermally, chemically, or optically.

As used herein, the term "insoluble film" means that sufficient pendant groups have been removed (or converted) from the polymer backbone to render the film significantly less soluble in the solvent the polymer was originally dissolved in. Preferably, the film has less than 50% the solubility, more preferably less than 10% the solubility, most preferably less than 1% the solubility of the polymer prior to removal or conversion of labile pendant groups.

The labile solubilizing group preferably contains a) a $C_4$-$C_{30}$ hydrocarbyl group or b) a $C_3$-$C_{30}$ hydrocarbyl group and one or more heteroatoms of S, N, Si, P, or O or c) an aralkyl group and optionally one or more heteroatoms of S, N, Si, P, or O. As used herein, the term "hydrocarbyl group" refers to a group that contains carbon and hydrogen atoms and optionally other atoms. The term "aralkyl group" is used herein to refer to aromatic and aliphatic groups that may optionally contains other atoms. More preferably, the labile solubilizing group includes $C_6$-$C_{20}$ alkyl groups such as n-hexyl, 2-ethylhexyl, n-octyl, n-decyl, or n-dodecyl groups, or $C_3$-$C_{20}$ alkyl groups that contain ether or thioether groups such as tertiary alkyl ether or tertiary alkyl thioether groups, or ester or thioester groups such as methyl or t-butyl esters of carboxylic acids, as illustrated:

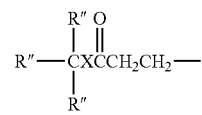

where each R" is independently H or $C_1$-$C_{10}$ alkyl; preferably each R is independently H, methyl or ethyl; more preferably each R" is methyl or ethyl; and most preferably each R" is methyl; and X is S or O, preferably O.

Other examples of suitable labile groups include alkylene benzene groups such as ethylene phenyl, alkyloxyphenyl groups such as t-butoxyphenyl, hexyloxyphenyl, or octyloxyphenyl groups, and alkylphenyl esters, as illustrated:

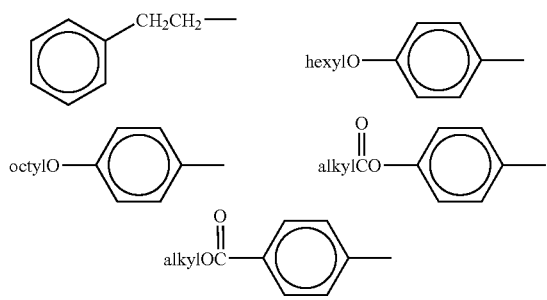

The polymer containing labile solubilizing groups may be a homopolymer, a copolymer, a terpolymer, etc. As used herein, the term "structural unit" is used to describe the remnant of a monomer after polymerization. The term "aromatic" is used herein to include heteroaromatic unless otherwise noted. The terms "aromatic monomer" and "aromatic fragment" are used herein to refer to monomers and fragments respectively that include aromatic groups. For example, a structural unit of a substituted 1,4-dibromobenzene is a substituted 1,4-phenylene. A structural unit of a 2,7-dibromo-9,9-disubstituted fluorene is a 9,9-disubstituted fluorene-2,7-diyl, as illustrated.

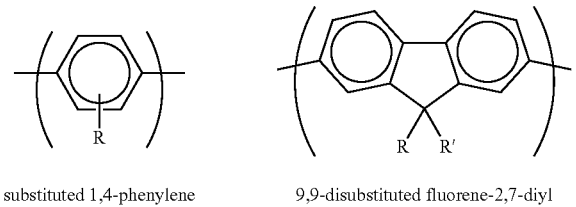

substituted 1,4-phenylene    9,9-disubstituted fluorene-2,7-diyl where R is a labile solubilizing group and R' is a labile solubilizing group or H.

Polymers Containing Labile Solubilizing Groups

The polymer containing labile solubilizing groups can be prepared by any of a number of means. For example, the polymer can be prepared by a Suzuki coupling reaction, described in U.S. Pat. No. 6,169,163 (the '163 patent), column 41, lines 50-67 to column 42, lines 1-24, which description is incorporated herein by reference.

The Suzuki coupling reaction can be carried out by coupling, in the presence of a transition metal catalyst, preferably a Pd/triphenylphosphine catalyst such as tetrakis(triphenylphosphine)palladium(0), one or more diboronated aromatic monomers with one or more dihalogenated aromatic monomers or by coupling one or more haloboronated aromatic monomers, wherein at least one of the monomers contains one or more solubilizing groups. The term "boronate" or "boronated" refers to an aromatic monomer or fragment that is substituted with a borane group; a boronic acid ester group, or a boronic acid group.

The Suzuki coupling reaction can also be carried out without a transition-metal catalyst by coupling a diboronated aromatic monomer with one or more dihalogenated aromatic aromatic monomers or by coupling one or more haloboronated aromatic monomers under microwave conditions in the presence of water, a strong base such as sodium carbonate, and a quaternary ammonium halide such as tetrabutyl ammonium bromide.

Polymerization can also be carried out by coupling one or more dihalogenated aromatic compounds in the presence of a nickel salt, as described in the '163 patent, column 11, lines 9-34, which description is incorporated herein by reference.

The variety of aromatic monomers that can be used to make the polymer of the present invention is nearly endless but a representative list includes, 1,4-diXbenzenes, 1,3-diXbenzenes, 1,2-diXbenzenes 4,4'-diXbiphenyls, diXnaphthalenes such as 1,4-diXnaphthalenes, 2,6-diXnaphthalenes, 2,5-diXfurans, 2,5-diXthiophenes, 5,5'-diX-2,2'-bithiophenes, 9,10-diXanthracenes, 4,7-diX-2,1,3-benzothiadiazoles, diX triarylamines including N,N-di(4-Xphenyl) anilines, N,N-di(4-Xphenyl)-p-tolylamines, and N-diXphenyl-N-phenylanilines, 3,6-diX-N-substituted carbazoles, 2,7-diX-N-substituted carbazoles, 3,6-diX-dibenzosiloles, 2,7-diX-dibenzosiloles, N-substituted-3,7-diXphenothiazines, N-substituted-3,7-diXphenoxazines, 3,7-diX-dibenzothiophenes, 2,8-diX-dibenzothiophenes, 3,7-diX-dibenzofuranes, 2,8-diX-dibenzofuranes, diX-N,N,N',N'-tetraaryl-1,4-diaminobenzenes, diX-N,N,N',N'-tetraarylbenzidines, diXarylsilanes, and 2,7-diX-9,9-disubstituted fluorenes, including fluorenes in which the 9,9-substituents combine to form a ring structure (i.e., a spirofluorene), and combinations thereof, where each X is independently a halogen or a boronate, preferably bromo or chloro or boronate, more preferably bromo or boronate.

Accordingly, the structural units corresponding to the above listed monomers are 1,4-phenylenes, 1,3-phenylenes, 1,2-phenylenes, 4,4'-biphenylenes, naphthalenediyls including naphthalene-1,4-diyls and naphthalene-2,6-diyls, furan-2,5-diyls, thiophene-2,5-diyls, 2,2'-bithiophene-5,5'-diyls, anthracene-9,10-diyls, 2,1,3-benzothiadiazoles-4,7-diyls, N-substituted carbazole-3,6-diyls, N-substituted carbazole-2,7-diyls, dibenzosilole-3,6-diyls, dibenzosilole-2,7-diyls, N-substituted-phenothiazine-3,7-diyls, N-substituted-phenoxazines-3,7-diyls, dibenzothiophene-3,7-diyls, dibenzothiophene-2,8-diyls, dibenzofurane-3,7-diyls, dibenzofurane-2,8-diyls, indenofluorene-diyls, triarylamine-diyls including triphenylamine-4,4'-diyls, diphenyl-p-tolylamine-4,4'-diyls, and N,N-diphenylaniline-3,5-diyls, N,N,N',N'-tetraaryl-1,4-diaminobenzene-diyls, N,N,N',N'-tetraarylbenzidine-diyls, arylsilane-diyls, and 9,9-disubstituted fluorenes-2,7-diyls and combinations thereof, with the proviso that at least some of the structural units contain a sufficient concentration of solubilizing labile pendant groups to render the polymer sufficiently soluble in a solvent to form an effective coating of the polymer on the desired substrate using solvent coating techniques.

Other polymers that contain labile solubilizing groups that are suitable for the practice of the method of the present invention include polyphenylvinylenes, polypyrroles, polyanilines, polyacetylenes, and polyacenes including tetracenes and pentacenes. The preparation of these polymers is described, for example, in "Handbook of Conducting Polymers" Second Edition, Revised and Expanded, Editors T. A. Skotheim, R. L. Elsenbaumer, and J. R. Reynolds, Copyright 1998, Chapter II, pp 197-422 and references therein.

The polymer preferably contains structural units of the above-illustrated 9,9-disubstituted fluorene-2,7-diyl where R is a) $C_4$-$C_{30}$ hydrocarbyl or b) $C_3$-$C_{30}$ hydrocarbyl containing one or more heteroatoms of S, N, P, Si, or O or c) an aralkyl group and optionally one or more heteroatoms of S, N, Si, P, or O; and R' is a) H or $C_4$-$C_{30}$ hydrocarbyl or b) $C_3$-$C_{30}$ hydrocarbyl containing one or more heteroatoms of S, N, P, Si, or O or c) an aralkyl group and optionally one or more heteroatoms of S, N, Si, P, or O.

Another example of a preferred copolymer is a copolymer containing structural units of a substituted or unsubstituted thiophene-2,5-diyl, preferably a copolymer containing structural units of a 3-$C_{4-20}$-alkylthiophene-2,5-diyl structural. More preferred alkyl groups are hexyl and octyl groups.

Yet another example of a preferred homopolymer of copolymer is a homopolymer or copolymer that contains structural units of a triarylamine containing labile ester groups, as illustrated:

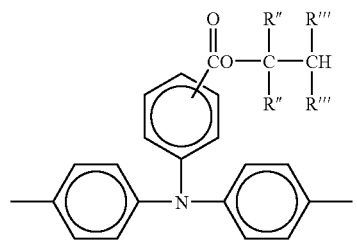

where each R" and each R''' is independently alkyl or H; preferably, each R" is methyl and each R''' is H. A more preferred copolymer contains structural units of a substituted or unsubstituted fluorene and a triarylamine that contains labile groups as illustrated above.

Preparation of an Insoluble Film on a Substrate

The insoluble polymeric film can be prepared by first dissolving the polymer containing solubilizing labile groups in one or more solvents (hereinafter, solvent), then applying the solution onto a substrate in any of a variety of ways including spin coating or dip coating, or any variety of direct printing methods such as ink jet printing, gravure, offset, flexographic, or screen printing. Examples of suitable solvents for the polymer include benzene; mono-, di- and trialkylbenzenes including $C_1$-$C_{12}$-alkyl benzenes, xylenes, mesitylene, cyclohexylbenzene, and diethylbenzene; furans including tetrahydrofuran and 2,3-benzofuran; 1,2,3,4-tetrahydronaphthalene; cumene; decalin; durene; chloroform; limonene; dioxane; alkoxybenzenes including anisole, and methyl anisoles; alkyl benzoates including methyl benzoate; biphenyls including isopropyl biphenyl; pyrrolidinones including cyclohexylpyrrolidinone; imidazoles including dimethylimidazolinone; and fluorinated solvents; and combinations thereof. More preferred solvents include $C_{1-8}$-alkyl benzenes, cyclohexylbenzene, xylenes, mesitylene, 1,2,3,4-tetrahydronaphthalene, methyl benzoate, isopropyl biphenyl, and anisole, and combinations thereof.

After the solution is applied, solvent is removed. The labile groups can be removed or converted, for example, thermally, chemically, or optically such as by application of UV light, and preferably after solvent is removed. Solubilizing alkyl and ester/thioester groups can be removed by thermal degradation, for example, by subjecting the film to temperature in the range of from about 250° C. to about 450° C. for a time sufficient to render the film insoluble. Solubilizing ester groups can also be removed by acid or base catalyzed hydrolysis to form a shorter chain acid group that imparts insolubility to the polymer. This conversion of a solubilizing labile group to a nonsolubilizing group is illustrated:

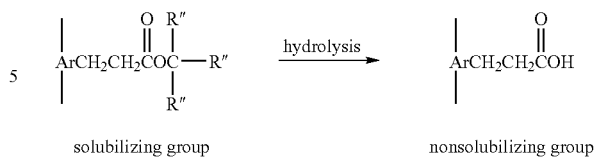

where Ar is an aromatic group in the polymer backbone. In a thermal degradation reaction of the above-illustrated alkylene ester, where R" is methyl, it is believed that the solubilizing group is completely removed to form ethylene, $CO_2$, and t-butylene, as illustrated.

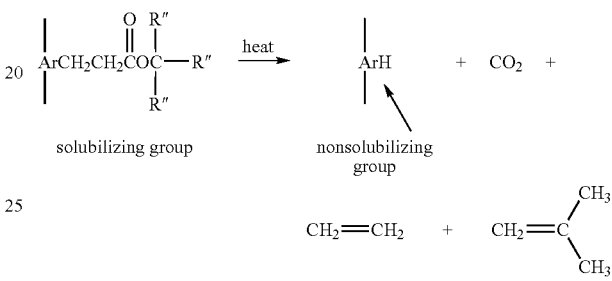

As noted above, labile groups can be completely removed, as is the case for an octyl or hexyl group, or converted from a solubilizing group into nonsolubilizing group. In another instance of such a conversion, a hexyloxyphenyl group can be thermally converted to hexene and a phenol group, which conversion causes a substantial reduction in the solubility of the polymer.

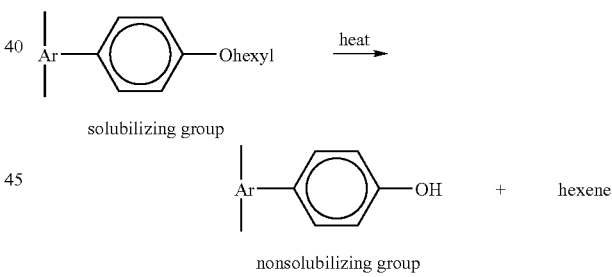

The substrate itself can vary greatly, and may include any surface on which graphical printing is typically applied such as milk cartons or paper products, to substrates designed for specific electronic applications such as silicon or gallium arsenide wafers, ceramic carriers, optical plate glass, or flexible plastic plate or film. Although not bound by theory, it is believed that the removal or conversion of pendant soluble groups a) permits optimization of the semiconducting backbone for charge transport performance, b) allows direct control of microstructure in the final film, and c) renders the final film more robust during subsequent process steps needed to construct multilayer devices.

The insoluble film prepared by the process of the present invention is useful as a coating for substrates such as paper, metals, plastic, ceramics, and semiconductors. These substrates, in turn, are useful in electronic devices such as thin film transistors, diodes, light emitting diodes, and solar cells.

The following example is for illustrative purposes only and is not intended to limit the scope of the invention.

EXAMPLE 1

Preparation of Insoluble Electroluminescent Film on a Silicon Wafer

A copolymer of 9,9-di-n-octylfluorene and bithiophene (F8T2) can be prepared by reacting an equimolar mixture of 5,5-dibromo-2,2'-bithiophene with 9,9-dioctyl-2,7-fluorene diboronate, as described in U.S. Pat. No. 6,169,163, column 41, lines 51-67 and column 42, lines 1-15, which description is incorporated herein by reference.

A 1% by weight solution of F8T2 in mesitylene was spin coated onto a 100 mm IR grade double side polished Si wafer. The wafer was then dried for 20 min at 200° C. under nitrogen. The resulting film had a thickness of approximately 90 nm. The wafer was then cleaved into ½ inch strips for subsequent treatment.

Thermal treatment of the wafer strips was carried out on a nitrogen purged hotplate at 400° C. for 10, 20, and 40 minutes. The wafer strips were analyzed by FT-IR. The intensity of aliphatic C—H absorption at 2923, 2854, and 1466 $cm^{-1}$ decreased as a function of exposure time. The intensity of the absorption due to the aromatic carbon rings (3067, 879 and 753 $cm^{-1}$) and to the thiophene rings (3067 and 789 $cm^{-1}$) did not change significantly. This indicates that the primary change in the structure of the polymer is loss of the aliphatic octyl groups with limited effect on the aromatic main chain.

The treated samples were then tested for solubility. Each wafer strip was placed in a vial containing about 30 mL of xylene, which is a known solvent for F8T2. The strips were allowed to sit in the xylene for about one hour to allow the xylene to extract the soluble polymer. The UV/Vis spectra was then recorded for each solution; the solution containing sample dried at 200° C., but with no subsequent high temperature processing, exhibited an absorbance maximum of about 1 at about 450 nm, as shown in FIG. 1A. The sample dried at 200° C. and treated for 10 min at 400° C. exhibited lower solubility in the solvent, as shown by the attenuated absorbance seen in FIG. 1B. The sample dried at 200° C. and treated at 400° C. for 20 min exhibited an even lower level of extracted material, as seen in FIG. 1C, and the sample dried at 200° C. and treated for 40 minutes at 400° C. displayed virtually no extraction into the xylene solvent, as seen by the almost total absence of an absorption, as illustrated in FIG. 1D.

EXAMPLE 2

Preparation of a Functionalized Triarylamine-Fluorene Copolymer

A. Synthesis of t-butyl-3-bromobenzoate

In an oven dried, 1-L, 3-necked round bottom flask equipped with an addition funnel, a glass stopper, a magnetic stirbar, and a reflux condenser connected to a nitrogen inlet, potassium t-butoxide (23.6 g, 209.6 mmol) was combined with toluene (150 mL). A solution of 3-bromobenzoyl chloride (40 g, 182.3 mmol) in toluene (100 mL) was added dropwise to the potassium t-butoxide and the mixture was stirred for 16 h at room temperature. The viscous mixture was transferred to a 1-L separatory funnel, and the reaction flask was rinsed with toluene (50 mL) and added to the separatory funnel. The toluene mixture was extracted with water (200 mL), a potassium carbonate solution (10%, 250 mL), and again with water (3×200 mL). The toluene layer was dried over magnesium sulfate and filtered, and the toluene was removed in vacuo to yield the product as a yellow oil (45.1 g, 96%). HPLC: >99% pure.

B. Synthesis of N,N-diphenyl-N-(3-t-butylcarboxyphenyl)amine

In a 1-L, 3-necked round bottom flask equipped with an overhead stirrer, a glass stopper, and a reflux condenser connected to a nitrogen inlet, palladium (II) acetate (585 mg, 2.61 mmol) and tri-o-tolylphosphine (1.67 g, 5.48 mmol) were combined with toluene (250 mL) and stirred under nitrogen for 15 minutes. Diphenylamine (14.70 g, 86.85 mmol), t-butyl-3-bromobenzoate (21.22 g, 82.52 mmol), sodium t-butoxide (12.52 g, 130.28 mmol), and toluene (250 mL) were added with stirring and reflux for 16 h. The mixture was cooled to room temperature and filtered through a coarse glass frit. The dark filtrate was passed through a column packed with silica gel (7×12 cm) and the filtered material was eluted with toluene, which was removed in vacuo to yield a dark oil, which crystallized upon standing overnight. The crystals were washed with ethanol, collected by filtration and dried in vacuo to yield the product as a white solid. The product was further recrystallized from ethanol to yield the product as white needles (15 g, 50%). HPLC: 99.7% pure.

C. Synthesis of N,N-di(4-bromophenyl)-N-(3-t-butylcarboxyphenyl)amine

In a 250-mL, 3-necked round bottom flask equipped with an addition funnel, a stopper, a magnetic stirbar, and a nitrogen inlet, N,N-diphenyl-N-(3-t-butylcarboxyphenyl)amine (12.00 g, 34.74 mmol) was dissolved in DMF (140 mL). The flask was cooled to 0° C. with an ice bath. A solution of N-bromosuccinimide (12.37 g, 69.48 mmol) in DMF (40 mL) was added dropwise via the addition funnel. After stirring for 1 h, the mixture was poured into water (200 mL) and a white precipitate formed. The solid was collected by filtration and washed with water. The solid was recrystallized from ethanol to yield the product as fluffy white crystals (3.5 g, 17%). To obtain more product, the milky liquor obtained from the initial filtration was extracted with methylene chloride (3×300 mL). The combined methylene chloride layers were washed with water (3×300 mL) and dried over magnesium sulfate. The solvent was then removed in vacuo to yield a yellow oil. The oil was dissolved in ethanol and cooled in a freezer. White crystals formed and were collected and dried to yield an additional 4.3 g (25%) of product improving the overall yield to 42%. HPLC: 99.3% pure.

D. Synthesis of Functionalized Triarylamine-Fluorene Copolymer

In a 250-mL, 3-necked round bottom flask equipped with an overhead stirrer, a glass stopper, and a reflux condenser connected to a nitrogen inlet, 2,7-bis(1,3,2-dioxaborolan-2-yl)-9,9-dioctylfluorene (2.898 g, 5.464 mmol), N,N-di(4-bromophenyl)-N-(3-t-butylcarboxyphenyl)amine (2.769 g, 5.464 mmol), and Aliquat 336 (0.8 g, 1.9 mmol) were combined with toluene (50 mL) and stirred until the solids dissolved. $Pd(PPh_3)_2Cl_2$ (4 mg, 0.005 mmol) and 2M $Na_2CO_3$ (aq) (12 mL) were added and the mixture was heated at 102° C. for 24 h. The reaction was capped with phenyl boronic acid (0.5 g) and more toluene (50 mL) and catalyst (4 mg) were added. The mixture was stirred at 102° C. for 24 h. The mixture was transferred to a 500-mL flask and an aqueous solution of sodium diethyldithiocarbamate trihydrate (7.5 g, 100 mL) was added along with more toluene (50 mL). The mixture was stirred at 80° C. for 24 h. The reaction mixture was transferred to a 1-L separatory funnel and washed with warm water (3×300 mL). The polymer was precipitated from methanol (2 L), collected by filtration, and washed with methanol (~500 mL). The polymer was transferred to a 1-L round bottom flask and excess methanol was removed in vacuo. The polymer was dissolved in toluene (400 mL) and passed through a column packed with silica gel (3×3 cm). The column was rinsed with toluene (300 mL) and the collected filtrate was concentrated in vacuo to a volume of ~150 mL. The polymer was precipitated from methanol (2 L), collected by filtration, and washed with methanol (~500 mL). The polymer was dried in a vacuum oven overnight at 60° C. Yield 2.8 g (70%). GPC $M_w$=194,000, $M_n$=42,000 PDI=4.6.

Thermogravimetric analysis (TGA) was used to study the pyrolysis reaction of the t-butyl ester in copolymer to the carboxylic acid form. The TGA of the copolymer from 25° C. to 600° C. at 10 C°/min indicated a weight loss at 241° C. which corresponds to the reaction in the illustrated reaction scheme. The calculated weight loss for this reaction is 7.64%, which is what is observed in the TGA scan.

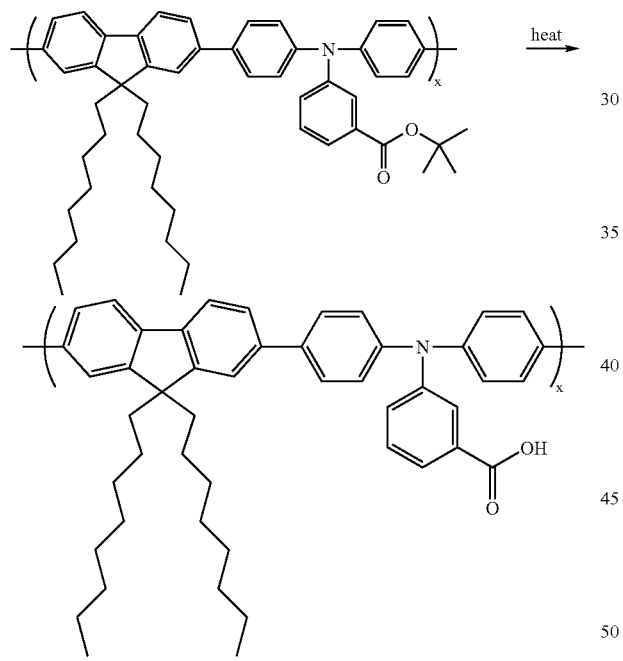

What is claimed is:

1. A method comprising the steps of
    a) applying to a substrate a solution of a solvent and a polymer containing labile solubilizing groups;
    b) removing the solvent from the solution to form a soluble polymer film; and
    c) removing a sufficient amount of the labile solubilizing groups from the soluble polymer film or converting a sufficient amount of the labile solubilizing group to less soluble groups, to form a film on the substrate that is less soluble in the solvent than before the removal or conversion of the labile solubilizing groups, wherein the polymer contains structural units selected from the group consisting of fluorene-2,7-diyls and triarylamine-diyls and the labile solubilizing groups contain a) a $C_4$-$C_{30}$ hydrocarbyl or b) a $C_3$-$C_{30}$ hydrocarbyl containing one or more heteroatoms of S, N, Si, P, or O, or c) an aralkyl group and optionally one or more heteroatoms of S, N, Si, P, or O.

2. The method of claim 1 wherein the polymer is an electroactive polymer.

3. The method of claim 1 wherein the labile groups are removed thermally, chemically, or optically, or combinations thereof.

4. The method of claim 2 wherein the polymer additionally contains structural units selected from the group consisting of 1,4-phenylenes, 1,3-phenylenes, 1,2-phenylenes, 4,4'-biphenylenes, naphthalene-1,4-diyls, naphthalene-2,6-diyls, furan-2,5-diyls, thiophene-2,5-diyls, 2,2'-bithiophene-5,5'-diyls, anthracenes-9,10-diyls, 2,1,3-benzothiadiazoles-4,7-diyls, N-substituted carbazole-3,6-diyls, N-substituted carbazole-2,7-diyls, dibenzosilole-3,6-diyls, dibenzosilole-2,7-diyls, N-substituted-phenothiazine-3,7-diyls, N-substituted-phenoxazines-3,7-diyls, dibenzothiophene-3,7-diyls, dibenzothiophene-2,8-diyls, dibenzofurane-3,7-diyls, dibenzofurane-2,8-diyls, indenofluorene-diyls, N,N,N',N'-tetraaryl- 1,4-di-aminobenzene-diyls, N,N,N',N'-tetraarylbenzidine-diyls, and arylsilane-diyls.

5. The method of claim 4 wherein the polymer contains structural units of a substituted fluorene-2,7-diyl as illustrated:

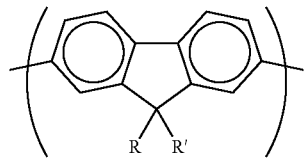

wherein R is a) a $C_4$-$C_{30}$ hydrocarbyl or b) a $C_3$-$C_{30}$ hydrocarbyl containing one or more heteroatoms of S, N, Si, P, or O, or c) an aralkyl group and optionally one or more heteroatoms of S, N, Si, P, or O; and R' is a) H or b) a $C_4$-$C_{30}$ hydrocarbyl or c) a $C_3$-$C_{30}$ hydrocarbyl containing one or more heteroatoms of S, N, Si, P, or O, or d) an aralkyl group and optionally one or more heteroatoms of S, N, Si, P, or O.

6. The method of claim 5, wherein R and R' are each:

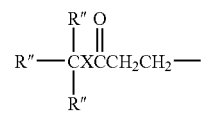

wherein R" is independently H or $C_1$-$C_{10}$ alkyl; and X is S or O.

7. The method of claim 6 wherein each R" is methyl and wherein X is O.

8. The method of claim 1 wherein the polymer further contains structural units of a thiophene-2,5-diyl.

9. The method of claim 8 wherein the polymer contains structural units of a 3-$C_{4-20}$-alkylthiophene-2,5-diyl.

10. The method of claim 5 wherein the polymer contains structural units of a triarylamine-4,4'-diyl containing labile ester groups, as illustrated:

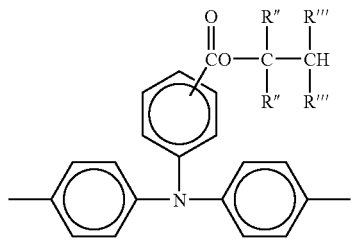

where each R" and each R'" is independently alkyl or H.

11. The method of claim 10 where each R" is methyl and each R'" is H.

12. The method of claim 1 wherein the substrate is selected from the group consisting of paper, metals, plastics, ceramics, and semiconductors.

13. The method of claim 1 wherein the substrate is a component of an electronic device.

14. A method comprising the steps of:
 a) applying to a substrate a solution of a solvent and a polymer containing labile solubilizing groups;
 b) removing the solvent from the solution to form a soluble polymer film; and
 c) removing a sufficient amount of the labile solubilizing groups from the soluble polymer film or converting a sufficient amount of the labile solubilizing groups to less soluble groups, to form a film on the substrate that is less soluble in the solvent than before the removal or conversion of the labile solubilizing groups,
 wherein the polymer contains structural units selected from the group consisting of fluorene-2,7-diyls and triarylamine-diyls.

15. The method of claim 1, wherein the fluorene-2,7-diyls are 9,9-disubstituted fluorenes-2,7-diyls.

16. The method of claim 1, wherein the triarylamine-diyls are triphenylamine-4,4'-diyls, diphenyl-p-tolylamine-4,4'-diyls, or N,N-diphenylaniline-3,5-diyls.

* * * * *